(12) United States Patent
Saito et al.

(10) Patent No.: US 11,916,164 B2
(45) Date of Patent: Feb. 27, 2024

(54) METHOD FOR MANUFACTURING LIGHT-EMITTING ELEMENT AND METHOD FOR REMOVING HYDROGEN FROM LIGHT-EMITTING ELEMENT

(71) Applicants: TOYODA GOSEI CO., LTD., Kiyosu (JP); MEIJO UNIVERSITY, Nagoya (JP)

(72) Inventors: Yoshiki Saito, Kiyosu (JP); Shinya Boyama, Kiyosu (JP); Shinichi Matsui, Kiyosu (JP); Hiroshi Miwa, Kiyosu (JP); Kengo Nagata, Kiyosu (JP); Tetsuya Takeuchi, Aichi-ken (JP); Hisanori Ishiguro, Aichi-ken (JP)

(73) Assignees: TOYODA GOSEI CO., LTD., Kiyosu (JP); MEIJO UNIVERSITY, Aichi-Ken (JP)

( * ) Notice: Subject to any disclaimer, the term of this patent is extended or adjusted under 35 U.S.C. 154(b) by 190 days.

(21) Appl. No.: 17/564,768

(22) Filed: Dec. 29, 2021

(65) Prior Publication Data
US 2022/0231189 A1 Jul. 21, 2022

(30) Foreign Application Priority Data
Jan. 19, 2021 (JP) ................................. 2021-006743

(51) Int. Cl.
*H01L 33/00* (2010.01)
*H01L 33/14* (2010.01)
(Continued)

(52) U.S. Cl.
CPC ........ *H01L 33/0095* (2013.01); *H01L 33/007* (2013.01); *H01L 33/145* (2013.01); *H01L 33/06* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 11,469,348 B1 * | 10/2022 | Shealy | H01L 33/007 |
| 2017/0186905 A1 * | 6/2017 | Shur | C25D 11/045 |

FOREIGN PATENT DOCUMENTS

| | | | |
|---|---|---|---|
| JP | H07-097300 A | | 4/1995 |
| JP | H11-126758 A | | 5/1999 |

(Continued)

*Primary Examiner* — Bradley Smith
(74) *Attorney, Agent, or Firm* — MCGINN I.P. LAW GROUP, PLLC

(57) ABSTRACT

A method for manufacturing a light-emitting element includes providing the light-emitting element that includes a light-emitting layer with an emission wavelength of not more than 306 nm and a p-type layer including AlGaInN including Mg as an acceptor, and removing hydrogen in the p-type layer from the light-emitting element by irradiating the light-emitting element with ultraviolet light at a wavelength of not more than 306 nm from outside and treating the light-emitting element with heat in a state in which a reverse voltage, or a forward voltage lower than a threshold voltage of the light-emitting element, or no voltage is applied to the light-emitting element. The removing of hydrogen in the p-type layer from the light-emitting element is performed in a $N_2$ atmosphere at not less than 650° C. or in a $N_2+O_2$ atmosphere at not less than 500° C.

8 Claims, 6 Drawing Sheets

(51) Int. Cl.
*H01L 33/06* (2010.01)
*H01L 33/32* (2010.01)

(56) References Cited

FOREIGN PATENT DOCUMENTS

| | | |
|---|---|---|
| JP | H11-238692 A | 8/1999 |
| JP | 2013-128009 A | 6/2013 |

* cited by examiner

METHOD FOR MANUFACTURING LIGHT-EMITTING ELEMENT AND METHOD FOR REMOVING HYDROGEN FROM LIGHT-EMITTING ELEMENT

CROSS-REFERENCE TO RELATED APPLICATIONS

The present patent application claims the priority of Japanese patent application No. 2021/006743 filed on Jan. 19, 2021, and the entire contents of Japanese patent application No. 2021/006743 are hereby incorporated by reference.

TECHNICAL FIELD

The present invention relates to a method for manufacturing a light-emitting element and a method for removing hydrogen from a light-emitting element.

BACKGROUND ART

A technique for removing hydrogen from nitride semiconductors doped with a p-type impurity is known (see, e.g., Patent Literature 1). The technique described in Patent Literature 1 includes a step of irradiating a p-type impurity-doped nitride semiconductor with an electromagnetic wave having an energy equal to or higher than a band gap energy of the nitride semiconductor, and a step of heat-treating the nitride semiconductor in an atmosphere substantially not including active hydrogen.

According to Patent Literature 1, hydrogen bonded to the p-type impurity to prevent the p-type impurity from acting as a normal acceptor is removed from the nitride semiconductor to reduce the resistance of the nitride semiconductor.

CITATION LIST

Patent Literature

Patent Literature 1: JP H11/238692 A

SUMMARY OF INVENTION

However, a light-emitting element formed of a nitride semiconductor may arise the problem that, if hydrogen removed from the p-type nitride semiconductor layer reaches a light-emitting layer of the light-emitting element, the output of the light-emitting element decreases significantly, e.g., not less than 20%.

Especially in case of a light-emitting element to emit light with a short wavelength, a p-type layer of a nitride semiconductor which has a high Al composition and a large band gap is used for suppressing absorption of light emitted from its own light-emitting layer. Since the high-energy light emitted from the light-emitting layer reaches the entire area of the p-type layer of the high Al composition nitride semiconductor, a large amount of hydrogen can be separated from the p-type impurity and thus moved to the light-emitting layer. Furthermore, since AlN is higher than GaN in hydrogen retention ability or heat resistance, it is difficult to remove hydrogen from the p-type layer of the high Al composition nitride semiconductor.

It is an object of the invention to provide a method for manufacturing a light-emitting element and a method for removing hydrogen from a light-emitting element by which hydrogen can be efficiently removed from even the p-type layer of the high Al composition nitride semiconductor without reducing the output of the light-emitting element.

According to an aspect of the invention, a method for manufacturing a light-emitting element defined by (1) to (4) below and a method for removing hydrogen from a light-emitting element defined by (5) to (8) below are provided.

(1) A method for manufacturing a light-emitting element, the method comprising:

providing the light-emitting element that comprises a light-emitting layer with an emission wavelength of not more than 306 nm and a p-type layer comprising AlGaInN including Mg as an acceptor; and removing hydrogen in the p-type layer from the light-emitting element by irradiating the light-emitting element with ultraviolet light at a wavelength of not more than 306 inn from outside and treating the light-emitting element with heat in a state in which a reverse voltage, or a forward voltage lower than a threshold voltage of the light-emitting element, or no voltage is applied to the light-emitting element, wherein the removing of hydrogen in the p-type layer from the light-emitting element is performed in a $N_2$ atmosphere at not less than 650° C. or in a $N_2\pm O_2$ atmosphere at not less than 500° C.

(2) The method defined by (1) above, wherein the reverse voltage is applied to the light-emitting element in the removing of hydrogen in the p-type layer from the light-emitting element.

(3) The method defined by (1) or (2) above, wherein the AlGaInN constituting the p-type layer comprises AlGaN with an Al composition of not less than 80%.

(4) The method defined by any one of (1) to (3) above, wherein the light-emitting element further comprises a substrate, an n-type layer on the substrate, the light-emitting layer on the n-type layer, the p-type layer on the light-emitting layer and a p-type contact layer on the p-type layer, wherein a band gap of the p-type contact layer is smaller than band gaps of the substrate and a layer located between the substrate and the light-emitting layer, and wherein in the removing of hydrogen in the p-type layer from the light-emitting element, the light-emitting element is irradiated, from a substrate side, with the ultraviolet light with an energy lower than the band gaps of the substrate and the layer located between the substrate and the light-emitting layer.

(5) A method for removing hydrogen from a light-emitting element, the method comprising:

providing the light-emitting element that comprises a light-emitting layer with an emission wavelength of not more than 306 nm and a p-type layer comprising AlGaInN including Mg as an acceptor; and removing hydrogen in the p-type layer from the light-emitting element by irradiating with ultraviolet light at a wavelength of not more than 306 nm from outside and treating with heat in a state in which a reverse voltage, or a forward voltage lower than a threshold voltage of the light-emitting element, or no voltage is applied to the light-emitting element, wherein the removing of hydrogen in the p-type layer from the light-emitting element is performed in a $N_2$ atmosphere at not less than 650° C. or in a $N_2+O_2$ atmosphere at not less than 500° C.

(6) The method defined by (5) above, wherein reverse voltage is applied to the light-emitting element in the removing of hydrogen in the p-type layer from the light-emitting element.

(7) The method defined by (5) or (6) above, wherein the AlGaInN constituting the p-type layer comprises AlGaN with an Al composition of not less than 80%.

(8) The method defined by any one of (5) to (7) above, wherein the light-emitting element further comprises a substrate, an n-type layer on the substrate, the light-emitting layer on the n-type layer, the p-type layer on the light-emitting layer and a p-type contact layer on the p-type layer, wherein a band gap of the p-type contact layer is smaller than band gaps of the substrate and a layer located between the substrate and the light-emitting layer, and wherein in the removing of hydrogen in the p-type layer from the light-emitting element, the light-emitting element is irradiated, from a substrate side, with the ultraviolet light with an energy lower than the band gaps of the substrate and the layer located between the substrate and the light-emitting layer.

EFFECTS OF INVENTION

According to an aspect of the invention, a method for manufacturing a light-emitting element and a method for removing hydrogen from a light-emitting element can be provided by which hydrogen can be efficiently removed from even the p-type layer of the high Al composition nitride semiconductor without reducing the output of the light-emitting element.

DESCRIPTION OF EMBODIMENTS (Configuration of a Light-Emitting Element)

Figure 1:
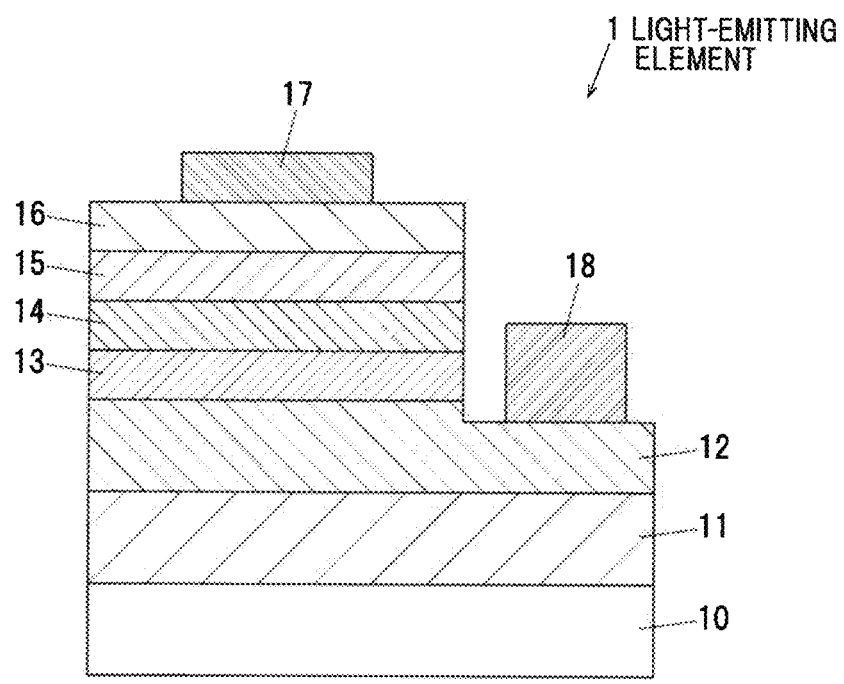
FIG. 1 is a vertical cross-sectional view showing a light-emitting element in an embodiment of the present invention.

FIG. 1 is a vertical cross-sectional view showing a light-emitting element 1 in an embodiment of the invention. The light-emitting element 1 is a flip chip-type light-emitting diode (LED).

The light-emitting element 1 includes a substrate 10, a buffer layer 11 on the substrate 10, an n-type contact layer 12 on the buffer layer 11, a light-emitting layer 13 on the n-type contact layer 12, an electron blocking layer 14 on the light-emitting layer 13, a hole supply layer 15 on the electron blocking layer 14, a p-type contact layer 16 on the hole supply layer 15, a p-electrode 17 connected to the p-type contact layer 16, and an n-electrode 18 connected to the n-type contact layer 12.

"On (preposition indicating position)" in the configuration of the light-emitting element 1 is "on" when the light-emitting element 1 is placed in a direction as shown in FIG. 1, and it means a direction from the substrate 10 toward the p-electrode 17.

The substrate 10 is a growth substrate formed of sapphire. A thickness of the substrate 10 is, e.g., 400-1000 µm. In addition to sapphire, it is possible to use AlN, Si, SiC, ZnO, etc., as a material of the substrate 10.

The buffer layer 11 has a structure in which, e.g., three layers; a nucleation layer, a low-temperature buffer layer and a high-temperature buffer layer, are sequentially stacked. The nucleation layer is a layer that is formed of non-doped AlN grown at a low temperature and is a nucleus of crystal growth. A thickness of the nucleation layer is, e.g., 10 nm. The low-temperature buffer layer is a layer that is formed of non-doped AlN grown at a higher temperature than the nucleation layer. A thickness of the low-temperature buffer layer is, e.g., 0.3 µm. The high-temperature buffer layer is a layer that is formed of non-doped AlN grown at a higher temperature than the low-temperature buffer layer. A thickness of the high-temperature buffer layer is, e.g., 2.7 µm. By providing such a buffer layer 11, a threading dislocation density in AlN is reduced and cracks are prevented.

The n-type contact layer 12 is formed of n-type AlGaInN including a donor such as Si and is typically formed of AlGaN. To suppress absorption of light emitted from the light-emitting layer 13 by the n-type contact layer 12, a band gap of the n-type contact layer 12 is preferably larger than a band gap of the light-emitting layer 13 (a band gap of well layers when the light-emitting layer 13 has a MQW structure). For example, when the n-type contact layer 12 and the light-emitting layer 13 are formed of AlGaN, an Al composition of the n-type contact layer 12 is preferably higher than an Al composition of the light-emitting layer 13 (an Al composition of the well layers when the light-emitting layer 13 has the MQW structure) and is preferably within a range of, e.g., not less than 50% and not more than 75%. In this case, the n-type contact layer 12 ideally has a composition expressed by $Al_xGa_{1-x}N$ ($0.5 \leq x \leq 0.75$). The above-mentioned percentage of the Al composition is a proportion of an Al content relative to the total of a Ga content and the Al content.

AlGaInN is a nitride semiconductor that is a compound of a group III element Al, Ga or In and N, and a band gap of AlGaInN tends to be larger with a higher Al composition and smaller with a higher In composition.

The light-emitting layer 13 is formed of AlGaInN and preferably has a multiple quantum well (MQW) structure. An emission wavelength of the light-emitting layer 13 is not more than 306 nm and the composition of the light-emitting layer 13 (the composition of the well layers when having the MQW structure) is set according to a desired emission wavelength which is not more than 306 nm. When, e.g., the light-emitting layer 13 is formed of AlGaN and has an emission wavelength of 270-290 nm, the Al composition is set to about 35-50%.

The light-emitting layer 13 has, e.g., a MQW structure having two well layers, i.e., a structure in which a first barrier layer, a first well layer, a second barrier layer, a second well layer and a third barrier layer are stacked in this order. The first well layer and the second well layer are formed of n-type AlGaN. The first barrier layer, the second barrier layer and the third barrier layer are formed of n-type AlGaN with a higher Al composition (including the Al composition of 100%, i.e., AlN) than the first well layer and the second well layer.

As an example, an Al composition, a thickness and a concentration of Si as a dopant for each of the first well layer and the second well layer are 40%, 2.4 nm and $9\times10^{18}$ cm$^{-2}$. An Al composition, a thickness and a concentration of Si as a dopant for each of the first barrier layer and the second barrier layer are 55%, 19 nm and $9\times10^{18}$ cm$^{-2}$. An Al composition, a thickness and a concentration of Si as a dopant for the third barrier layer are 55%, 4 nm and $5\times10^{18}$ cm$^{-2}$.

The electron blocking layer 14 is a layer to suppress diffusion of electrons to the p-type contact layer 16 side and is formed of p-type AlGaInN including Mg as an acceptor. A Mg concentration in the electron blocking layer 14 is, e.g., $1\times10^{18}$-$5\times10^{20}$ cm$^{-3}$.

To suppress absorption of light emitted from the light-emitting layer 13 by the electron blocking layer 14, a band gap of the electron blocking layer 14 is preferably larger than the band gap of the light-emitting layer 13 (the band gap of the well layers when the light-emitting layer 13 has the MQW structure). For example, when the electron blocking layer 14 and the light-emitting layer 13 are formed of AlGaN, an Al composition of the electron blocking layer 14 is preferably higher than the Al composition of the light-emitting layer 13 (the Al composition of the well layers when the light-emitting layer 13 has the MQW structure) and the electron blocking layer 14 typically has an Al composition of not less than 80% (including 100%). A thickness of the electron blocking layer 14 is, e.g., 1-50 nm.

The hole supply layer 15 is formed of p-type AlGaInN including Mg as an acceptor. A Mg concentration in the hole supply layer 15 is, e.g., $1\times10^{18}$-$1\times10^{21}$ cm$^{-3}$. Typically, the hole supply layer 15 is formed of AlGaN with an Al composition higher than that of the light-emitting layer 13 and lower than that of the electron blocking layer 14. A thickness of the hole supply layer 15 is, e.g., 10-100 nm.

The p-type contact layer 16 is formed of p-type AlGaInN including Mg as an acceptor. AlGaInN with a low Al composition (including GaInN, GaN) may be used as a material of the p-type contact layer 16 to improve its contact properties with the p-electrode 17, A Mg concentration in the p-type contact layer 16 is, e.g., $1\times10^{19}$-$5\times10^{21}$ cm$^{-3}$. A thickness of the p-type contact layer 16 is, e.g., 5-30 nm.

The p-electrode 17 is formed of a material which can make ohmic contact with the p-type contact layer 16, such as ITO, IZO, ZnO, Al, Rh, Ag, etc. Meanwhile, the n-electrode 18 is formed of a material which can make ohmic contact with the n-type contact layer 12, such as Ti/Al, V/Al, etc.

(Problem Caused by Hydrogen in p-Type Layer)

In the state immediately after film formation of the electron blocking layer 14, the hole supply layer 15 and the p-type contact layer 16 which are p-type layers, a Mg—N—H bond is formed in these layers due to bonding between nitrogen in AlGaInN, Mg as an acceptor and hydrogen included in source gases, etc. Mg included in the Mg—N—H bond is prevented from acting as an acceptor, hence, formation of the Mg—N—H bond causes an increase in electrical resistance of the p-type layer and an increase in an initial forward voltage ($V_F$) of the light-emitting element 1.

Then, when the light-emitting element 1 is operated in the state immediately after film formation, light with a wavelength of not more than 306 nm emitted by the light-emitting layer 13 breaks the N—H bond in the Mg—N—H bond since the light has an energy equal to or higher than 4.1 eV which is a bond energy of the N—H bond, and hydrogen which is in a free state and can move to the light-emitting layer 13 is generated. Then, by a forward voltage of not less than a threshold voltage that is applied to operate the light-emitting element 1, hydrogen dissociated from N is attracted to the n-electrode 18 side and passes through the light-emitting layer 13, which generates point defects and causes a decrease in output of the light-emitting element 1. In addition, heat generated due to absorption of light emitted from the light-emitting layer 13 by the p-type layer also accelerates bond scission or movement of the dissociated hydrogen.

Particularly in case of a p-type layer formed of AlGaInN with a high Al composition, a large amount of free hydrogen which can move to the light-emitting layer 13 is likely to be generated and it is also difficult to remove hydrogen by heat treatment, etc., for the following reasons.

The p-type layer formed of AlGaInN with a high Al composition has a large band gap and is thus less likely to absorb light emitted from the light-emitting layer 13. Therefore, light reaches the entire area of the p-type layer and breaks the N—H bond in the Mg-N-H bond in the entire area of the p-type layer, hence, the amount of free hydrogen which can move to the light-emitting layer 13 becomes particularly large. In addition, since Al has a stronger ability to retain H than Ga, it is difficult to remove hydrogen from the p-type layer formed of AlGaInN with a high Al composition. If the temperature of heat treatment to remove hydrogen is increased, it is possible to remove hydrogen more effectively. However, since the upper limit is set for the heat treatment temperature in practice to suppress damage on the light-emitting element 1 due to heat, hydrogen is likely to remain in AlGaInN with a high Al composition.

In the light-emitting element 1 of the present embodiment, the electron blocking layer 14, the hole supply layer 15 and the p-type contact layer 16 correspond to the p-type layer and the electron blocking layer 14 has the highest Al composition among them. When, e.g., the electron blocking layer 14 is formed of AlGaN with an Al composition of not less than 80%, removal of hydrogen from the p-type layer is particularly difficult, hence, the method for removing hydrogen according to the invention is particularly effective.

(Method for Manufacturing the Light-Emitting Element)

Next, an example of a method for manufacturing the light-emitting element 1 in the embodiment of the invention will be described. When forming each layer of the light-emitting element 1 by a vapor-phase growth method, a Ga source gas, an Al source gas and an N source gas used are, e.g., respectively trimethylgallium, trimethylaluminum and ammonia. Meanwhile, a source gas of Si as an n-type dopant and a source gas of Mg as a p-type dopant used are, e.g., respectively a silane gas and a bis(cyclopentadienyl) magnesium gas. In addition, a carrier gas used is, e.g., a hydrogen gas or a nitrogen gas.

Firstly, the substrate 10 is prepared and the buffer layer 11 is formed thereon. When forming the buffer layer 11, the nucleation layer formed of AlN is firstly formed by the MOVPE method. The growth temperature is, e.g., 880° C. The nucleation layer may be formed by the sputtering method. Next, the low-temperature buffer layer and the high-temperature buffer layer, which are formed of AlN, are sequentially formed on the nucleation layer by the MOVPE method. The growth conditions for the low-temperature buffer layer are, e.g., a growth temperature of 1090° C. and a growth pressure of 50 mbar. The growth conditions for the high-temperature buffer layer are, e.g., a growth temperature of 1270° C. and a growth pressure of 50 mbar.

Next, the n-type contact layer 12 formed of AlGaN including Si is formed on the buffer layer 11 by the MOVPE method. The growth conditions for the n-type contact layer 12 are, e.g., a growth temperature of 980° C. and a growth pressure of 50-100 mbar.

Next, the light-emitting layer 13 is formed on the n-type contact layer 12 by the MOVPE method. The light-emitting layer 13 is formed by stacking the first barrier layer, the first well layer, the second barrier layer, the second well layer and the third barrier layer in this order. The growth conditions for the light-emitting layer 13 are, e.g., a growth temperature of 975° C. and a growth pressure of 400 mbar.

Next, the electron blocking layer 14 is formed on the light-emitting layer 13 by the MOVPE method. The growth conditions for the electron blocking layer 14 are, e.g., a growth temperature of 975° C. and a growth pressure of 400 mbar.

Next, the hole supply layer 15 is formed on the electron blocking layer 14 by the MOVPE method. The growth conditions for the hole supply layer 15 are, e.g., a growth temperature of 1000-1100° C. and a growth pressure of 50 mbar.

Next, the p-type contact layer 16 is formed on the hole supply layer 15 by the MOVPE method. The growth conditions for the p-type contact layer 16 are, e.g., a growth temperature of 980° C. and a growth pressure of 50 mbar.

Next, a predetermined region on the surface of the p-type contact layer 16 is dry etched and a trench with a depth reaching the n-type contact layer 12 is thereby formed.

Next, the p-electrode 17 is formed on the p-type contact layer 16 and the n-electrode 18 is formed on the n-type contact layer 12 exposed on the bottom surface of the trench. The p-electrode 17 and the n-electrode 18 are formed by sputtering or vapor deposition, etc.

Next, hydrogen included in the electron blocking layer 14, the hole supply layer 15 and the p-type contact layer 16, which are p-type layers, is removed from the light-emitting element 1 by the method described below.

In a state in which a reverse voltage, or a forward voltage lower than a threshold voltage of the light-emitting element 1 (e.g., 2V), or no voltage is applied between the p-electrode 17 and the n-electrode 18 of the light-emitting element 1, the light-emitting element 1 is irradiated with ultraviolet light at a wavelength of not more than 306 nm from the outside and is treated with heat, and hydrogen in the electron blocking layer 14, the hole supply layer 15 and the p-type contact layer 16, which are p-type layers, is thereby removed from the light-emitting element 1.

The reason why hydrogen is removed in the state in which a reverse voltage, or a forward voltage lower than the threshold voltage of the light-emitting element 1, or no voltage is applied is that, if voltage of not less than the threshold voltage of the light-emitting element 1 is applied, hydrogen dissociated from N in the Mg—N—H bond is attracted to the n-electrode 18 side and move toward the light-emitting layer 13. Here, by applying the reverse voltage, the hydrogen dissociated from N can be attracted to the p-electrode 17 side and can be more reliably removed without passing through the light-emitting layer 13.

Meanwhile, the reason for irradiating with ultraviolet light at a wavelength of not more than 306 nm is to break the N—H bond in the Mg—N—H bond by irradiation with light having an energy equal to or higher than 4.1 eV which is the bond energy of the N—H bond. In addition, since hydrogen cannot be effectively removed if the ultraviolet light is absorbed by other layers before it reaches the p-type layers, the ultraviolet light preferably has a wavelength in a band it is not absorbed by the layers through which it passes before reaching the p-type layers.

AlGaN with a low Al composition (including GaN) may be used as a material of the p-type contact layer 16 to improve its contact properties with the p-electrode 17, as described above. In such a case, generally, the p-type contact layer 16 has a smaller band gap than those of the substrate 10 and layers (the buffer layer 11 and the n-type contact layer 12) located between the substrate 10 and the light-emitting layer 13, hence, it is preferable to irradiate with ultraviolet light from the substrate 10 side to avoid absorption of the ultraviolet light by the p-type contact layer 16. In addition, in this ease, to suppress absorption by the substrate 10 and the layers located between the substrate 10 and the light-emitting layer 13, it is irradiated with ultraviolet light having an energy lower than the band gaps of the substrate 10 and the layers located between the substrate 10 and the light-emitting layer 13.

Meanwhile, heat treatment is performed to accelerate N—H bond scission in the Mg—N—H bond or movement of hydrogen, which is dissociated from N, from the p-type layers. The reason for performing the hydrogen removing step in a $N_2$ atmosphere at not less than 650° C. or in a $N_2+O_2$ atmosphere at not less than 500° C. is to effectively remove hydrogen even when the p-type layers include a layer formed of AlGaN with an Al composition of not less than 80% such as the electron blocking layer 14. It is possible to effectively remove hydrogen by performing the hydrogen removing step in a $N_2$ atmosphere not including hydrogen, and it is possible to remove hydrogen more effectively by performing the hydrogen removing step particularly in a $N_2$ atmosphere at not less than 650° C. In addition, when oxygen is included in the atmosphere, an interfacial energy of a crystal surface (a surface of the p-type contact layer 16) decreases, making it easier to remove hydrogen. When the hydrogen removing step is performed in a $N_2+O_2$ atmosphere for this reason, hydrogen can be removed more effectively under the temperature condition of not less than 500° C.

The light-emitting element to which the method for removing hydrogen from the p-type layer according to the invention can be applied is not limited to the light-emitting device 1 in the present embodiment, and the method can also be applied to light-emitting elements having other configurations. That is, according to the invention, it is possible to provide a method for manufacturing a light-emitting element that comprises a light-emitting layer emitting light with a wavelength of not more than 306 nm and a p-type layer comprising AlGaInN including Mg as an acceptor, the method comprising: a step of forming the light-emitting element that comprises the light-emitting layer and the p-type layer; and a step of removing hydrogen in the p-type layer from the light-emitting element by irradiating with ultraviolet light at a wavelength of not more than 306 nm from the outside and treating with heat in a state in which a reverse voltage, or a forward voltage lower than a threshold voltage of the light-emitting element, or no voltage is applied to the light-emitting element, wherein the step of removing H in the p-type layer from the light-emitting element is performed in a $N_2$ atmosphere at not less than 650° C. or in a $N_2+O_2$ atmosphere at not less than 500° C.

The method for removing hydrogen from the p-type layer according to the invention can also be independently performed on already-manufactured light-emitting elements, not as a part of the manufacturing process. That is, according to the invention, it is possible to provide a method for removing hydrogen from a light-emitting element that comprises a light-emitting layer with an emission wavelength of not more than 306 nm and a p-type layer comprising AlGaInN including Mg as an acceptor, the method comprising: a step of removing hydrogen in the p-type layer from the light-emitting element by irradiating with ultraviolet light at a wavelength of not more than 306 nm from the outside and treating with heat in a state in which a reverse voltage, or a forward voltage lower than a threshold voltage of the light-emitting element, or no voltage is applied to the light-emitting element, wherein the step of removing hydrogen in the p-type layer from the light-emitting element is performed in a $N_2$ atmosphere at not less than 650° C. or in a $N_2+O_2$ atmosphere at not less than 500° C.

(Effects of the Embodiment)

In the embodiment of the invention, it is possible to prevent a decrease in output of the light-emitting element by removing hydrogen from the p-type layer formed of a nitride semiconductor without through the light-emitting layer. In addition, it is possible to effectively remove hydrogen even when the p-type layer is formed of a nitride semiconductor with a high Al composition.

EXAMPLES

Next, an influence of hydrogen in the p-type layer on output of the light-emitting element was examined using the light-emitting element 1 emitting light at a wavelength of not more than 306 nm with an energy equal to or higher than 4.1 eV which is the bond energy of the N—H bond. The examination result is described below. Table 1 below shows the configuration of the light-emitting element 1 used for this examination.

TABLE 1

| | | Material | Al composition | Thickness |
|---|---|---|---|---|
| p-type contact layer 16 | | GaN | 0% | 18 nm |
| p-type cladding layer | | GaN | 0% | 400 nm |
| Hole supply layer 15 | | GaN | 0% | 50 nm |
| Electron blocking layer 14 | | AlGaN | 85% | 25 nm |
| Light-emitting layer 13 | Barrier layer | AlGaN | 50% | 5.5 nm |
| | Well layer | AlGaN | 40% | 2.5 nm |
| | Barrier layer | AlGaN | 50% | 11 nm |
| | Well layer | AlGaN | 40% | 2.5 nm |
| | Barrier layer | AlGaN | 50% | 11 nm |
| n-type contact layer 12 | | AlGaN | 60% | 1.3 μm |
| Buffer layer 11 | High-temperature buffer layer | AlN | — | 2.7 μm |
| | Low-temperature buffer layer | AlN | — | 0.3 μm |
| | Nucleation layer | AlN | — | 0.01 μm |
| Substrate 10 | | Sapphire | — | 900 μm |

The light-emitting element 1 in this Example, which has the configuration shown in Table 1, has an emission wavelength of 280 nm which is included in the UVC wavelength range. In addition, in this Example, a light-emitting element having an emission wavelength of 340 nm which is included in the UVA wavelength range (referred to as a light-emitting element A) was used as Comparative Example.

Figure 2:
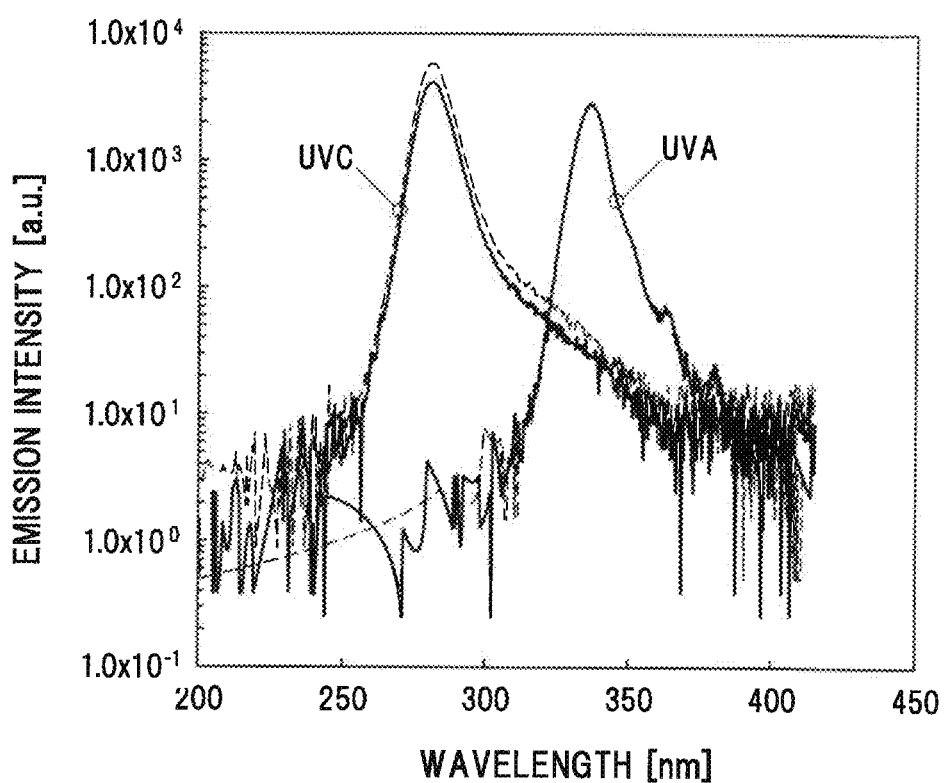
FIG. 2 is a graph showing emission spectra of a light-emitting element with an emission wavelength of 280 nm and a light-emitting element with an emission wavelength of 340 nm before and after aging.

FIG. 2 is a graph showing emission spectra of the light-emitting element 1 with an emission wavelength of 280 nm and the light-emitting element A with an emission wavelength of 340 nm before and after aging (application of 9V forward voltage for 100 hours).

In FIG. 2, "UVC" shows an emission spectrum of the light-emitting element 1 and "UVA" shows an emission spectrum of the light-emitting element A. In addition, each spectrum indicated by a dotted line is a spectrum measured before aging, and each spectrum indicated by a solid line is a spectrum measured after aging.

According to FIG. 2, the emission spectral intensity of the light-emitting element A hardly changed before and after aging. It is considered that this is because the N—H bond in the Mg—N—H bond was not broken since the emission wavelength of the light-emitting element A was 340 nm and its energy was lower than 4.1 eV which is the bond energy of the N—H bond, and there was almost no hydrogen that moved to the light-emitting layer.

On the other hand, according to FIG. 2, the emission spectral intensity of the light-emitting element 1 decreased after aging. It is considered that this is because the N—H bond in the Mg—N—H bond was broken since the emission wavelength of the light-emitting element 1 was 280 nm and its energy was higher than 4.1 eV which is the bond energy of the N—H bond, and the dissociated hydrogen moved to the light-emitting layer 13 due to the forward voltage applied to the light-emitting element 1, etc.

Figure 3A:
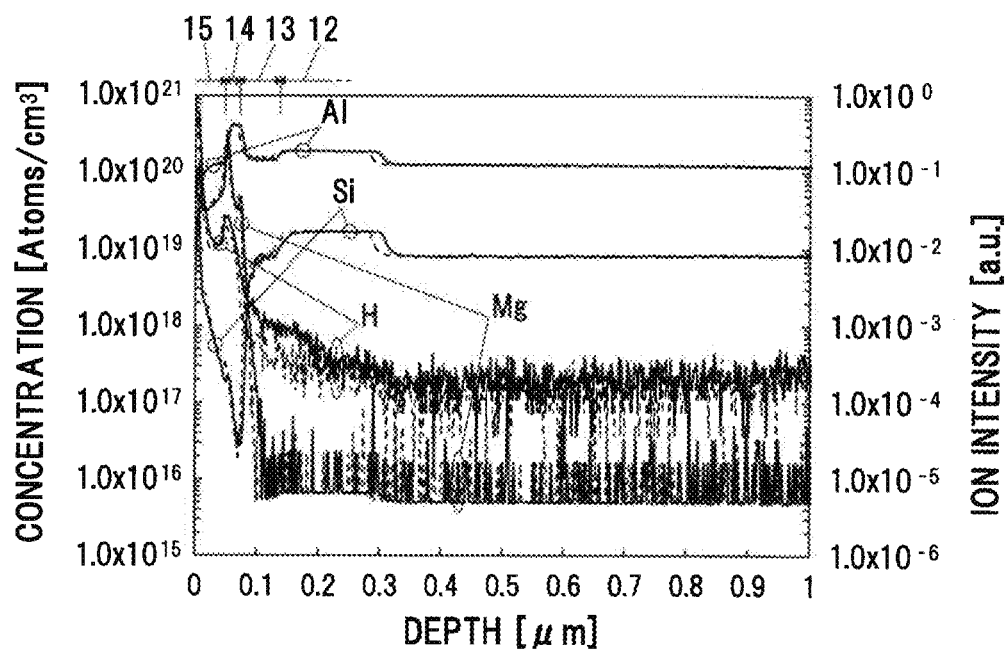
FIGS. 3A and 3B are graphs showing SIMS profiles of Al, Mg, Si and H before and after aging of the light-emitting elements.

FIG. 3A is a graph showing secondary-ion mass spectrometry (SIMS) profiles of Al, Mg, Si and H before and after aging of the light-emitting element A. Meanwhile, FIG. 3B is a graph showing SIMS profiles of Al, Mg, Si and H before and after aging of the light-emitting element 1.

Figure 3B:
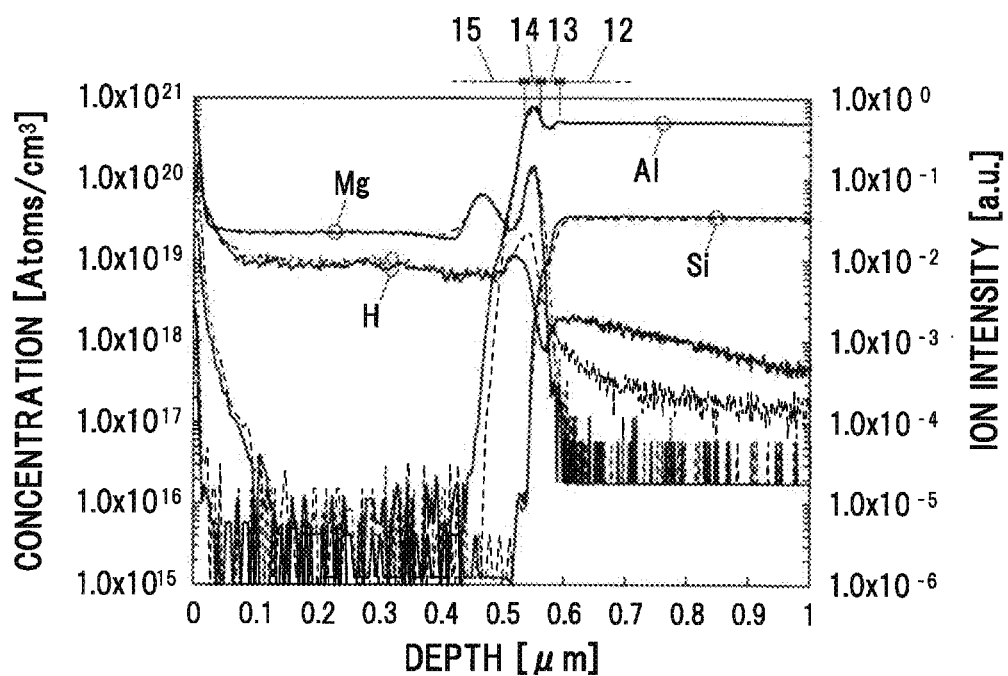

In FIGS. 3A and 3B, the profile of each element indicated by a dotted line is a profile measured before aging, and the profile indicated by a solid line is a profile measured after aging.

The ranges indicated by "12", "13", "14" and "15" in FIG. 3B are ranges respectively corresponding to the n-type contact layer 12, the light-emitting layer 13, the electron blocking layer 14 and the hole supply layer 15, and these ranges can be identified since the concentrations of Al, Si and Mg change, "12", "13", "14" and "15" in FIG. 3A are ranges respectively corresponding to an AlGaN layer with an Al composition of 20-30% which corresponds to the n-type contact layer 12, a MQW structure which corresponds to the light-emitting layer 13 and has AlGaN layers with an Al composition of 7.5% as the well layers, an AlGaN later with an Al composition of 50% which corresponds to the electron blocking layer 14, and an AlGaN layer with an Al composition of 20-30% which corresponds to the hole supply layer 15.

According to FIG. 3A, the H concentration hardly changed before and after aging. This means that movement of hydrogen due to light emission of the light-emitting element A hardly occurred. It is considered that this is because the N—H bond in the Mg—N—H bond in the p-type layers was not broken by the light emitted by the light-emitting element A and hydrogen could not move from the p-type layers.

On the other hand, according to FIG. 3B, a decrease in the H concentration in the electron blocking layer 14 as the p-type layer and an increase in the H concentration in the n-type contact layer 12 occurred after aging. This means that hydrogen in the electron blocking layer 14 passed through the light-emitting layer 13 and moved to the n-type contact layer 12 side due to the light emission of the light-emitting element 1. It is considered that this is because the N—H bond in the Mg—N—H bond in the electron blocking layer 14 was broken by the light emitted by the light-emitting element 1 and the dissociated hydrogen moved toward the n-electrode 18 due to the forward voltage applied to the light-emitting element 1, etc.

Figure 4:
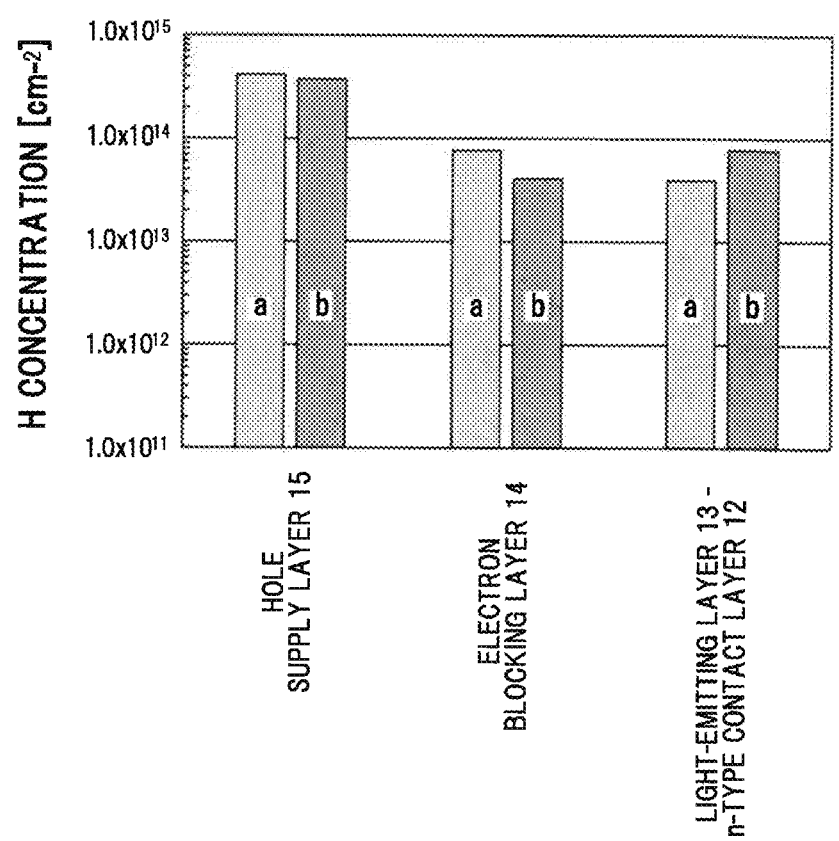
FIG. 4 is a bar graph showing H concentrations respectively in a hole supply layer, in an electron blocking layer and in from a light-emitting layer to an n-type contact layer of the light-emitting element which are read from the SIMS profiles in FIG. 3B.

FIG. 4 is a bar graph showing the H concentrations ($cm^{-2}$) respectively in the hole supply layer 15, in the electron blocking layer 14 and in from the light-emitting layer 13 to the n-type contact layer 12 of the light-emitting element 1 which are read from the SIMS profiles in FIG. 3B. In FIG. 4, the concentration before aging is indicated by "a" and the concentration after aging is indicated by "b".

Next, an effect of the method for removing hydrogen from the p-type layer according to the invention was examined using the light-emitting element 1 emitting light at a wavelength of not more than 306 nm with an energy equal to or higher than 4.1 eV which is the bond energy of the N—H bond. The examination result is described below. Table 2 below shows the configuration of the light-emitting element 1 used for this examination. For this examination, the light-emitting element 1 in a wafer form before singulation was used.

TABLE 2

|  |  | Material | Al composition | Thickness |
|---|---|---|---|---|
| p-type contact layer 16 |  | GaN | 0% | 18 nm |
| Hole supply layer 15 |  | AlGaN | 60% | 50 nm |
| Electron blocking layer 14 |  | AlGaN | 85% | 25 nm |
| Light-emitting layer 13 | Barrier layer | AlGaN | 50% | 5.5 nm |
|  | Well layer | AlGaN | 40% | 1.8 nm |
|  | Barrier layer | AlGaN | 50% | 11 nm |
|  | Well layer | AlGaN | 40% | 1.8 nm |
|  | Barrier layer | AlGaN | 50% | 11 nm |
| n-type contact layer 12 |  | AlGaN | 60% | 1.3 μm |
| Buffer layer 11 | High-temperature buffer layer | AlN | — | 2.7 μm |
|  | Low-temperature buffer layer | AlN | — | 0.3 μm |
|  | Nucleation layer | AlN | — | 0.01 μm |
| Substrate 10 |  | Sapphire | — | 900 μm |

Figure 5:
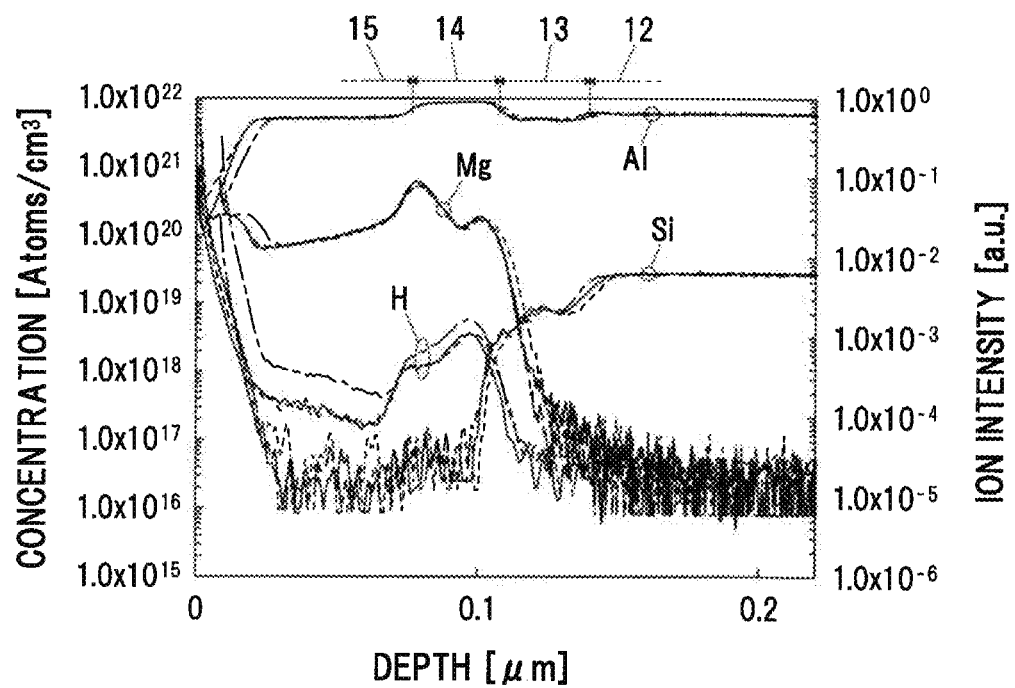
FIG. 5 is a graph showing SIMS profiles of Al, Mg, Si and H of the light-emitting element in a state immediately after being manufactured, in a state after heat treatment, and in a state after heat treatment and irradiation with ultraviolet light.

FIG. 5 is a graph showing SIMS profiles of Al, Mg, Si and H of the light-emitting element 1 in the state immediately after being manufactured, in the state after heat treatment at 550° C. in an air atmosphere, and in the state after heat treatment at 550° C. in an air atmosphere and irradiation with ultraviolet light with a peak wavelength of 280 nm.

In FIG. 5, the profile of each element indicated by a dash-dot line is a profile measured immediately after being manufactured, the profile indicated by a dotted line is a profile measured after performing heat treatment, and the profile indicated by a solid line is a profile measured after performing heat treatment and irradiation with ultraviolet light. In this regard, the heat treatment and the irradiation with ultraviolet light were performed in the state in which no voltage was applied to the light-emitting element 1.

The ranges indicated by "12", "13", "14" and "15" in FIG. 5 are ranges respectively corresponding to the n-type contact layer 12, the light-emitting layer 13, the electron blocking layer 14 and the hole supply layer 15, and these ranges can be identified since the concentrations of Al, Si and Mg change.

According to FIG. 5, the H concentrations in the electron blocking layer 14 and the hole supply layer 15, which are p-type layers, decreased after the heat treatment and further decreased after the heat treatment and the irradiation with ultraviolet light. In addition, no increase in the H concentrations in the light-emitting layer 13 and the n-type contact layer 12 is observed. It is considered that this is because the N—H bond in the Mg—N—H bond in the p-type layers was broken by the heat treatment and the hydrogen, which was dissociated from N, moved to the p-electrode 17 side and was removed without passing through the light-emitting layer 13, and in addition, hydrogen was removed more effectively by using a combination of the heat treatment and the irradiation with ultraviolet light.

The reason why the difference between the H concentration after performing only the heat treatment and the H concentration after performing the heat treatment and the irradiation with ultraviolet light is not large is that it was not possible to irradiate with a sufficient amount of ultraviolet light because of a device used for SIMS profile measurement pertain to FIG. 5, and the H concentration in the p-type layer can be reduced more significantly if irradiated with a sufficient amount of ultraviolet light. In addition, the hydrogen removing step was performed in the air atmosphere as described above, but in case of performing it in a $N_2$ atmosphere at not less than 650° C. or a $N_2+O_2$ atmosphere at not less than 500° C., the H concentration in the p-type layer can be reduced further significantly both when only the heat treatment is performed and when the heat treatment and the irradiation with ultraviolet light are performed.

Figure 6:
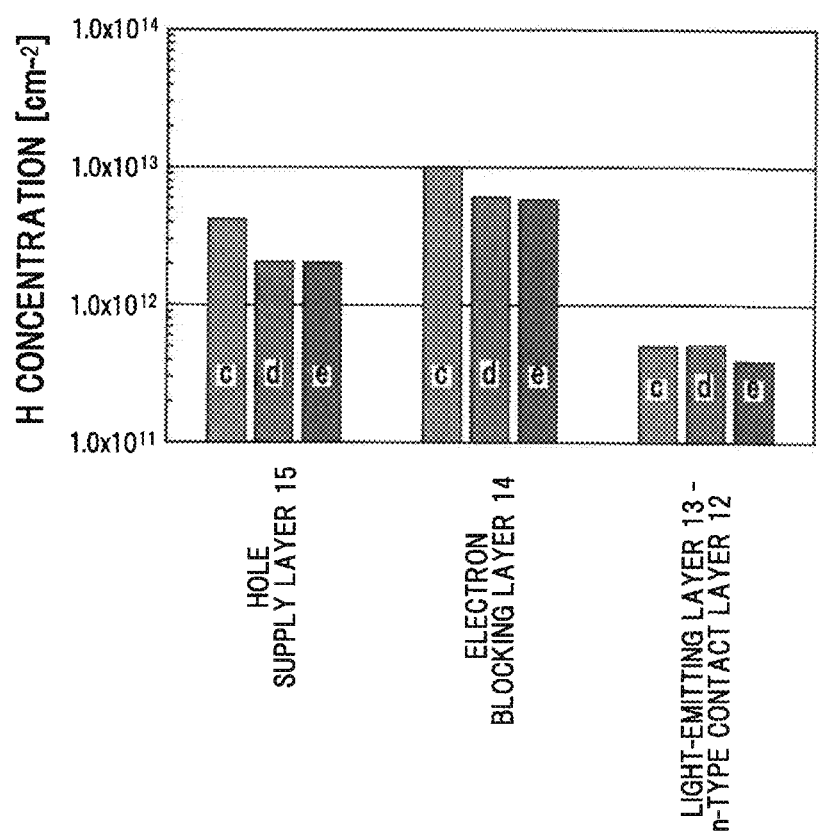
FIG. 6 is a bar graph showing the H concentrations respectively in the hole supply layer, in the electron blocking layer and in from the light-emitting layer to the n-type contact layer of the light-emitting element which are read from the SIMS profiles in FIG. 5.

FIG. 6 is a bar graph showing the H concentrations ($cm^{-2}$) respectively in the hole supply layer 15, in the electron blocking layer 14 and in from the light-emitting layer 13 to the s-type contact layer 12 of the light-emitting element 1 which are read from the SIMS profiles in FIG. 5.

In FIG. 6, the concentration immediately after being manufactured is indicated by "c", the concentration after performing the heat treatment at 550° C. in an air atmosphere is indicated by "d", and the concentration after the heat treatment at 550° C. in an air atmosphere and the irradiation with ultraviolet light with a peak wavelength of 280 nm is indicated by "e".

Although the embodiment and Examples of the invention have been described, the invention is not limited to the embodiment and Examples, and the various kinds of modifications can be implemented without departing from the gist of the invention. In addition, the constituent elements in the embodiment and Examples can be arbitrarily combined without departing from the gist of the invention.

In addition, the embodiment and Examples described above do not limit the invention according to claims. Further, please note that not all combinations of the features described in the embodiment and Examples are necessary to solve the problem of the invention.

REFERENCE SIGNS LIST

1 Light-Emitting Element
10 Substrate
11 Buffer Layer
12 N-Type Contact Layer
13 Light-Emitting Layer
14 Electron Blocking Layer
15 Hole Supply Layer
16 P-Type Contact Layer
17 P-Electrode
18 N-Electrode

The invention claimed is:

1. A method for manufacturing a light-emitting element, the method comprising:
 providing the light-emitting element that comprises a light-emitting layer with an emission wavelength of not more than 306 nm and a p-type layer comprising AlGaInN including Mg as an acceptor; and
 removing hydrogen in the p-type layer from the light-emitting element by irradiating the light-emitting element with ultraviolet light at a wavelength of not more than 306 nm from outside and treating the light-emitting element with heat in a state in which a reverse voltage, or a forward voltage lower than a threshold voltage of the light-emitting element, or no voltage is applied to the light-emitting element, wherein the removing of hydrogen in the p-type layer from the light-emitting element is performed in a $N_2+O_2$ atmosphere at not less than 500° C.

2. The method according to claim 1, wherein the reverse voltage is applied to the light-emitting element in the removing of hydrogen in the p-type layer from the light-emitting element.

3. The method according to claim 1, wherein the AlGaInN constituting the p-type layer comprises AlGaN with an Al composition of not less than 80%.

4. The method according to claim 1, wherein the light-emitting element further comprises a substrate, an n-type layer on the substrate, the light-emitting layer on the n-type layer, the p-type layer on the light-emitting layer and a p-type contact layer on the p-type layer, wherein a band gap of the p-type contact layer is smaller than band gaps of the substrate and a layer located between the substrate and the light-emitting layer, and wherein in the removing of hydrogen in the p-type layer from the light-emitting element, the light-emitting element is irradiated, from a substrate side, with the ultraviolet light with an energy lower than the band gaps of the substrate and the layer located between the substrate and the light-emitting layer.

5. A method for removing hydrogen from a light-emitting element, the method comprising:

providing the light-emitting element that comprises a light-emitting layer with an emission wavelength of not more than 306 nm and a p-type layer comprising AlGaInN including Mg as an acceptor; and removing hydrogen in the p-type layer from the light-emitting element by irradiating with ultraviolet light at a wavelength of not more than 306 nm from outside and treating with heat in a state in which a reverse voltage, or a forward voltage lower than a threshold voltage of the light-emitting element, or no voltage is applied to the light-emitting element, wherein the removing of hydrogen in the p-type layer from the light-emitting element is performed in a $N_2+O_2$ atmosphere at not less than 500° C.

6. The method according to claim 5, wherein reverse voltage is applied to the light-emitting element in the removing of hydrogen in the p-type layer from the light-emitting element.

7. The method according to claim 5, wherein the AlGaInN constituting the p-type layer comprises AlGaN with an Al composition of not less than 80%.

8. The method according to claim 5, wherein the light-emitting element further comprises a substrate, an n-type layer on the substrate, the light-emitting layer on the n-type layer, the p-type layer on the light-emitting layer and a p-type contact layer on the p-type layer, wherein a band gap of the p-type contact layer is smaller than band gaps of the substrate and a layer located between the substrate and the light-emitting layer, and wherein in the removing of hydrogen in the p-type layer from the light-emitting element, the light-emitting element is irradiated, from a substrate side, with the ultraviolet light with an energy lower than the band gaps of the substrate and the layer located between the substrate and the light-emitting layer.

* * * * *